United States Patent
Huang et al.

(10) Patent No.: US 6,225,187 B1
(45) Date of Patent: May 1, 2001

(54) METHOD FOR STI-TOP ROUNDING CONTROL

(75) Inventors: Tse Yao Huang, Taipei; Yun Sen Lai, Hsinchu Hsien, both of (TW)

(73) Assignee: Nanya Technology Corporation (TW)

( * ) Notice: Subject to any disclaimer, the term of this patent is extended or adjusted under 35 U.S.C. 154(b) by 0 days.

(21) Appl. No.: 09/283,301

(22) Filed: Apr. 1, 1999

(30) Foreign Application Priority Data

Feb. 12, 1999 (TW) .................................................. 88102265

(51) Int. Cl.[7] .................................................... H01L 21/76
(52) U.S. Cl. .......................... 438/424; 438/431; 438/433
(58) Field of Search ..................................... 438/424, 435, 438/438, 692, 296, 431, 432, 433, 714

(56) References Cited

U.S. PATENT DOCUMENTS

| | | | |
|---|---|---|---|
| 5,258,332 | * 11/1993 | Horioka et al. ....................... | 437/228 |
| 5,578,518 | * 11/1996 | Koike et al. ........................... | 437/67 |
| 5,674,775 | * 10/1997 | Ho et al. ................................. | 437/67 |
| 5,968,842 | * 10/1999 | Hsiao .................................... | 438/692 |
| 6,005,279 | * 12/1999 | Luning .................................. | 438/424 |
| 6,153,478 | * 11/2000 | Lin et al. ............................... | 438/296 |

* cited by examiner

Primary Examiner—David Nelms
Assistant Examiner—Phuc T. Dang
(74) Attorney, Agent, or Firm—Michael D. Bednarek; Shaw Pittman

(57) ABSTRACT

This present discloses a method for STI top rounding control, the steps comprising: (a) providing a semiconductor substrate; (b) forming an oxide layer on the substrate; (c) forming a hard mask on the oxide layer; (d) forming a photoresist pattern with an opening exposing the hard mask at a predetermined STI trench region on the hard mask; (e) etching the exposed hard mask and the underlying oxide layer within the opening in sequence, and continuously over-etching to remove part of the semiconductor substrate to form a window lower than the surface of the oxide layer; and (f) using the photoresist pattern and the hard mask as an etching mask, removing part of the exposed semiconductor substrate in the window to form an STI trench.

14 Claims, 4 Drawing Sheets

METHOD FOR STI-TOP ROUNDING CONTROL

FIELD OF THE INVENTION

The invention relates to an STI process, and more particularly relates to an STI top-rounding process.

BACKGROUND OF THE INVENTION

With the increasing integration of ICs, hundreds of thousands of MOS transistors can be formed on a silicon substrate with an area of 1~2 $cm^2$ in an advanced VLSI process. In order to operate the transistors independently, each transistor must be isolated to prevent shorting. The process is called the "isolation process".

A conventional isolation process comprises the following steps. First, an oxide and a hard mask are formed on a semiconductor substrate in sequence. Then, a window is defined at the determined STI site by using photolithography and etching techniques. Subsequently, the exposed substrate within the window is removed to form an STI trench. The detailed process is illustrated in FIGS. 1A~1C.

First, referring to FIG. 1A, a semiconductor substrate 100, such as a silicon substrate, is provided. Then, an oxide 110 (e.g. a silicon dioxide layer) and a hard mask layer 120 (e.g. a nitride layer) are formed on the semiconductor substrate 100 in sequence. Then, a photoresist pattern 130 with a opening 140 exposing the hard mask 120 at in a predetermined STI site is formed on the hard mask 120 by photolithography techniques.

Next, referring to FIG. 1B, the exposed hard mask 120 and the underlying oxide layer 110 and semiconductor substrate 100 within the opening 140 are etched to form an etching window 140' exposing the semiconductor substrate 100 by means of photolithography techniques.

Finally, referring to FIG. 1C, the photoresist layer 130 is removed, and the exposed semiconductor substrate 100 within the opening 140' is etched out by using the hard mask 120 as an etching mask, thus an STI trench 150 is formed. The STI trench 150 can be further gap-filled by an insulating material, though this step is not detailed here.

It is noted that the corners of the STI trench 150 are very sharp, therefore the STI channel obtained after gap-filling with an insulating material will make the insulating layer around the corners thinner than at other sites. Hence, leakage current or double hump may be apparent during operation, thus establishing a parasitic electric field.

In order to address the drawback of the conventional STI process described above, it is necessary to develop a novel STI process to forming top-rounded trenches for isolation.

SUMMARY OF THE INVENTION

In order to address the drawback of the conventional STI process described above, this invention discloses a method for STI top-rounding control.

The feature of the invention is to provide a method for STI top rounding control, the steps comprising: (a) providing a semiconductor substrate; (b) forming an oxide layer on the substrate; (c) forming a hard mask on the oxide layer; (d) forming a photoresist pattern with a opening exposing the hard mask at a predetermined STI trench region on the hard mask; (e) etching the exposed hard mask and the underlying oxide layer within the opening in sequence, and continuously over-etching to remove part of the semiconductor substrate to form a window lower than the surface of the oxide layer; and (f) using the photoresist pattern and the hard mask as etching masks, removing part of the exposed semiconductor substrate within the window to form an STI trench.

In the method described above, the semiconductor substrate is a silicon substrate. The oxide layer consists of a silicon dioxide layer. The hard mask can be nitride selected from the group consists of silicon nitride or silicon oxynitride. The etching process applied in step (e) is dry-etching, wherein the etchant is composed of a mixture of $CHF_3/CF_4/O_2/AR$ ($Ar/CHF_3$ ratio ranging from 3~6) or $SF_6/CHF_3$ (ratio ranging from 1~3). The thickness of the removed substrate is about 100~300 Å. The etching process applied in step (f) is dry-etching, wherein the etchant is composed of a mixture of $HBr/Cl_2/O_2$ ($HBr/Cl_2$ ratio ranging from 1~5). Moreover, the method described above can further comprise a step of gap-filling the STI trench with an insulating material to form an STI channel. The material used to gap-fill the STI trench can be, for example, silicon dioxide.

Other feature and advantages of the invention will be apparent from the following detailed description, and from the claims.

DETAILED DESCRIPTION OF THE INVENTION

The present invention provides a novel method for STI top rounding control characterized by defining the STI trenches by means of a two-step etching process.

According to the present invention, a substrate is provided first, wherein the substrate can further comprise semiconductor devices. Next, an oxide layer, for example a silicon dioxide layer, and a hard mask consisting of a nitride selected from silicon nitride or silicon oxynitride are formed on the semiconductor substrate in sequence. Subsequently, a photoresist pattern with an opening exposing the hard mask at a predetermined STI site is formed on the hard mask by means of photolithography.

Using the photoresist pattern as a mask, the exposed hard mask and the underlying oxide layer and part of the substrate are removed by means of dry etching to form a window lower than the surface of the oxide layer, wherein the etchant used in this dry-etching process is a mixture consisted of $CHF_3/CF_4/O_2/Ar$ or $SF_6/CHF_3$.

Then, using the photoresist pattern and the hard mask as an etching mask, the exposed semiconductor substrate within the window is etched-off by dry-etching to form an STI trench, wherein the etchant used in this dry-etching process is a mixture consisting of $HBr/Cl_2/O_2$.

Moreover, the method described above can further comprise a step of gap-filling the STI trench with an insulating material to form an STI channel.

Therefore, top-rounded STI trenches and/or channels can be obtained by using of this present invention, and leakage-current or double hump present in conventional STI process can be significantly reduced.

EMBODIMENT OF THE INVENTION

Figure 1A:
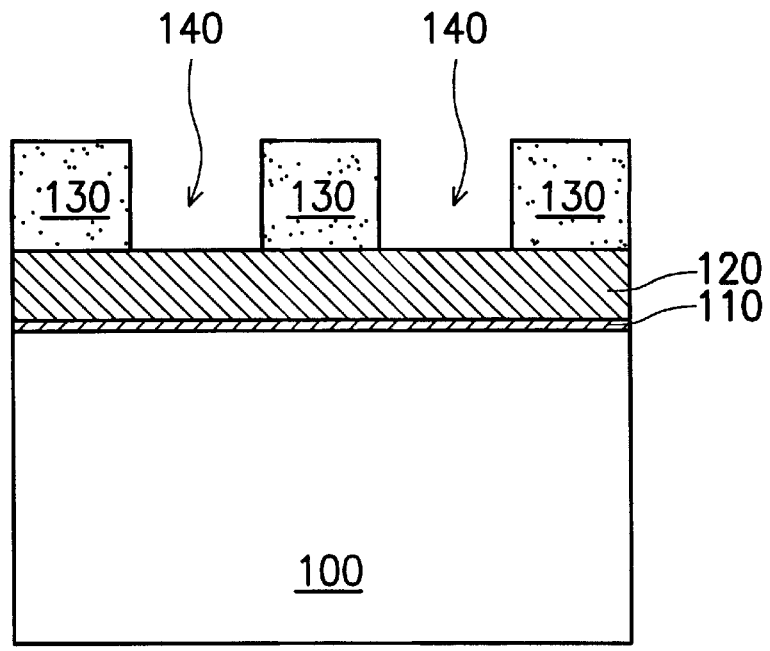
FIGS. 1A~1C are cross-sectional views of a conventional process for making STI trenches.
Figure 1B:
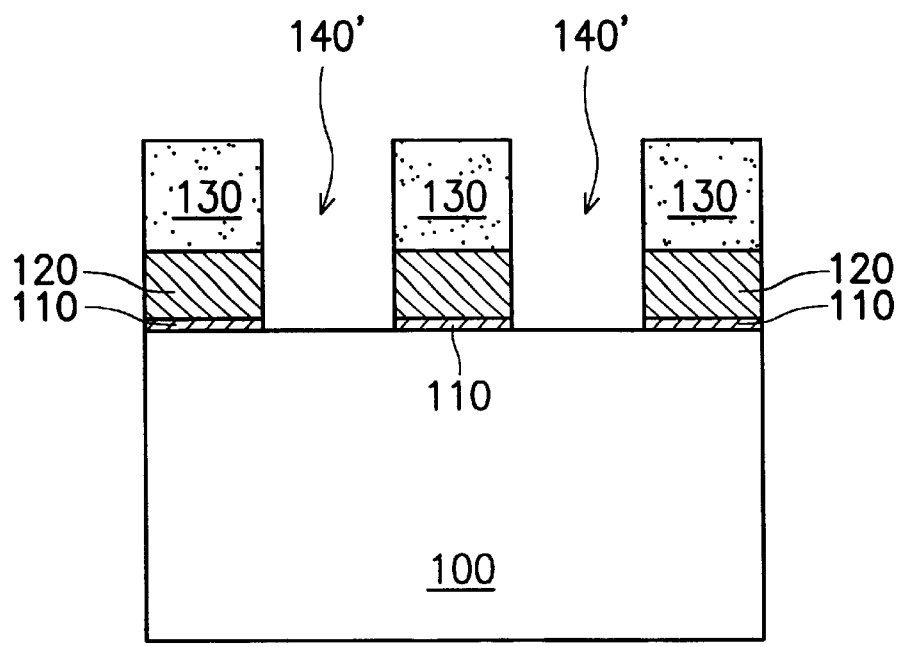
Figure 1C:
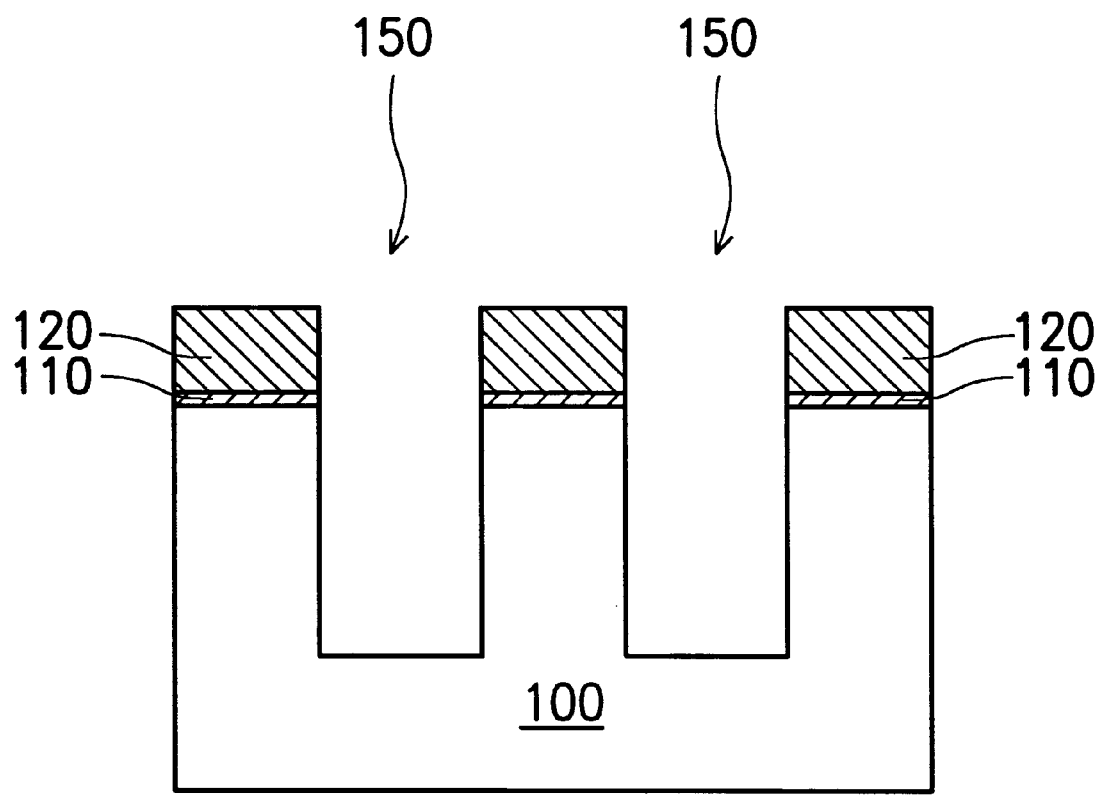
Figure 2A:
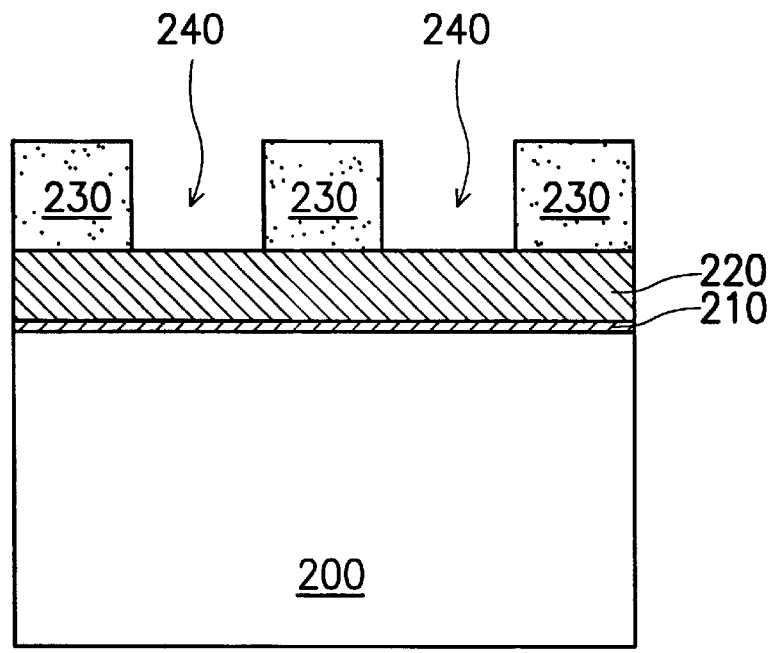
FIGS. 2A~2C are cross-sectional views of process for making STI trenches according to an embodiment of this invention.

First, referring to FIG. 2A, a semiconductor substrate 200 was provided. Then, an oxide layer 210 such as silicon dioxide, and a hard mask 220 such as a nitride layer consisting of silicon nitride or silicon oxynitride were formed on the oxide layer 200 in sequence. Then, a photoresist pattern was formed on the hard mask 210 with an opening 240 exposing the hard mask 220 at the predetermined STI site by means of photolithography techniques.

Figure 2B:
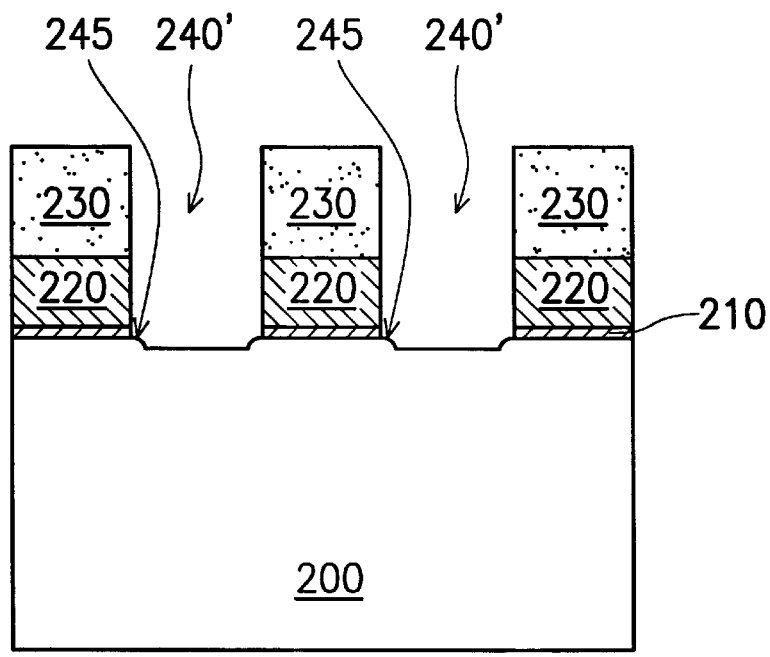

Next, referring to FIG. 2B, the exposed hard mask 220 and the underlying oxide layer 210 within the opening 240 were removed by an etching gas consisting of a mixture of $CHF_3/CF_4/O_2/Ar$ ($Ar/CHF_3$ ratio ranging from 3 to 6) or a mixture consisting of $SF_6/CHF_3$ (ratio ranging from 1~3) by using the photoresist pattern 230 as a mask. After the exposed hard mask 220 and the underlying oxide layer 210 were removed, part of the substrate with a thickness of 100~300 Å was removed by a subsequent over-etching process; thus, a windows 240' with a surface lower than the oxide layer 210 was formed. It is noted that the corner 245 of the window 240' was round.

Figure 2C:
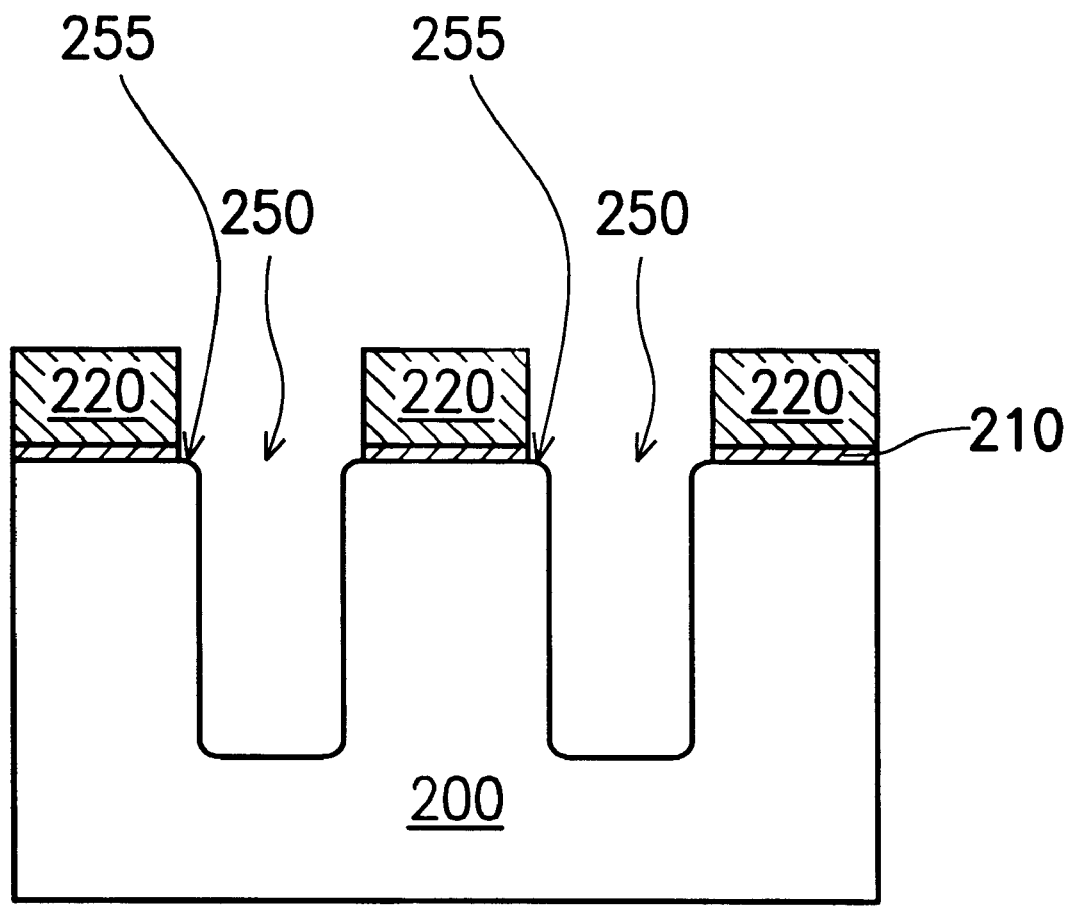

Subsequently, referring to FIG. 2C, the semiconductor substrate 200 within the window 240' was removed by an etching gas consisting of a mixture of $HBr/Cl_2/O_2$ ($HBr/Cl_2$ ratio ranging from 1~5) using the photoresist pattern 230 and the hard mask 220 as an etching mask, thus forming an STI trench 250. It is noted that because the corner 245 of the window 240' was round, the corner 255 of the STI trench 250 was also round. Therefore, the method disclosed in this present invention is effective in addressing the drawback of the prior art. In addition, an insulating material can be used to gap-fill the STI trench 250 with round corners 255 to form an improved STI channel with round corners. Since this gap-filling step is not the feature of this invention, however, no detailed description will be given.

From the above description, one skilled in this art can easily ascertain the essential characteristics of the present invention, and, without departing from the spirit and scope thereof, can make various changes and modifications of the invention to adapt it to various usage and conditions. Thus, other embodiments also fall within the scope of the following claims.

What is claim:

1. A method for STI top-rounding control, the steps comprising:

(a) providing a semiconductor substrate;

(b) forming an oxide layer on the substrate;

(c) forming a hard mask on the oxide layer;

(d) forming a photoresist pattern with an opening exposing the hard mask at a predetermined STI trench region on the hard mask;

(e) etching the exposed hard mask and the underlying oxide layer within the opening in sequence, and continuously over-etching to remove part of the semiconductor substrate to form a window lower than the surface of the oxide layer wherein corners of the window are round; and (f) using the photoresist pattern and the hard mask as an etching mask, removing part of the exposed semiconductor substrate within the window to form an STI trench.

2. The method as claimed in claim 1, wherein the semiconductor substrate is a Si substrate.

3. The method as claimed in claim 1, wherein the oxide consists of silicon dioxide.

4. The method as claimed in claim 1, wherein the hard mask consists of nitride.

5. The method as claimed in claim 4, wherein the hard mask consists of silicon nitride.

6. The method as claimed in claim 4, wherein the hard mask consists of silicon oxynitride.

7. The method as claimed in claim 1, wherein the step (e) is applied by means of dry-etching.

8. The method as claimed in claim 7, wherein the etchant used in the etching step is a mixture consisting of $CHF_3/CF_4/O_2/Ar$.

9. The method as claimed in claim 7, wherein the etchant used in the etching step is a mixture consisting of $SiF_6/CHF_3$.

10. The method as claimed in claim 1, wherein the thickness of the semiconductor substrate removed during step (e) is about 100~300 Å.

11. The method as claimed in claim 1, wherein step (f) is applied by means of dry-etching.

12. The method as claimed in claim 11, wherein the etchant used in the etching step is a mixture consisting of $HBr/Cl_2/O_2$.

13. The method as claimed in claim 1, further comprising a step of gap-filling the STI trench with an insulating material to form an STI channel.

14. The method as claimed in claim 13, wherein the insulating material consists of silicon dioxide.

* * * * *